United States Patent [19]

Johnson et al.

[11] Patent Number: 4,872,260
[45] Date of Patent: Oct. 10, 1989

[54] METHOD OF MAKING PRE-FORMED LEAD-INS FOR AN IC PACKAGE

[75] Inventors: Robert R. Johnson, Ludlow; Robert S. Orbanic, Warren, both of Pa.

[73] Assignee: GTE Products Corporation, Stamford, Conn.

[21] Appl. No.: 145,337

[22] Filed: Jan. 19, 1988

[51] Int. Cl.⁴ .......................................... H01R 43/00
[52] U.S. Cl. .................................... 29/827; 174/52.4; 357/70
[58] Field of Search ............ 29/827; 174/52 FP, 52.4; 357/70, 72

[56] References Cited

U.S. PATENT DOCUMENTS

| | | | |
|---|---|---|---|
| 4,079,511 | 3/1978 | Grabbe | 357/70 X |
| 4,496,965 | 1/1985 | Orcutt et al. | 357/70 |
| 4,554,404 | 11/1985 | Gilder, Jr. et al. | 174/52 FP |
| 4,663,650 | 5/1987 | Gilder, Jr. et al. | 174/52 FP X |
| 4,663,651 | 5/1987 | Gilder, Jr. et al. | 174/52 FP X |
| 4,698,660 | 10/1987 | Kubota et al. | 357/70 |
| 4,711,700 | 12/1987 | Cusack | 357/72 X |

OTHER PUBLICATIONS

IBM Tech Discl Bull., vol. 28, No. 12, May 1986, pp. 5174–5175.

Primary Examiner—Carl J. Arbes
Attorney, Agent, or Firm—William H. McNeill

[57] ABSTRACT

Lead-ins for IC packages are pre-formed before attachment to a package substrate. The process comprises forming lead-in segments in continuous strip with the lead-ins being maintained in position by oppositely disposed, removable rails. A segment is separated from the strip and one end of the lead-ins is formed into, e.g., a "J" shape. One rail is removed during the forming process. The last rail is not removed until the segment is mounted upon a substrate.

1 Claim, 6 Drawing Sheets

METHOD OF MAKING PRE-FORMED LEAD-INS FOR AN IC PACKAGE

TECHNICAL FIELD

This invention relates to integrated circuit (IC) packages and more particularly to a method of making pre-formed lead-ins therefor.

BACKGROUND ART

Integrated circuit chips are usually mounted within ceramic or plastic housings so that they may be more easily handled and mounted to printed circuits boards.

The Plastic housings or packages are provided in two distinct varieties; i.e., post-molded and pre-molded.

In the post molded applications an IC chip is mounted upon a lead frame and the plastic package molded thereabout. In the pre-molded application, a plastic package is pre-formed; leads are attached thereto and formed to provide terminations; a chip is applied to the package, connections made; and a cover is applied to seal the package.

A prime example of the latter technique is shown in U.S. Pat. No. 4,653,174, which is assigned to the assignee of the instant invention, and the teachings of which are hereby incorporated by reference.

As noted in the above-described process, after the lead-ins, in the form of a segment, are attached to a package body, the outside terminal ends of the leads are formed to provide a suitable connector; e.g., a "J" lead, for making a surface mount contact with a printed circuit board. During this post forming of the lead-ins, the plastic package will be subjected to stress and occasional cracking as the metal frame is formed. There also is difficulty in holding dimensional accuracy of the lead-ins, and, the tooling required to hold the package, and the form punches themselves, are of a complex and sometimes flimsy design.

SUMMARY OF THE INVENTION

It is, therefore, an object of the invention to obviate the disadvantages of the prior art.

It is another object of the invention to enhance IC packages.

Yet another object of the invention is the improvement of a method of making a pre-molded IC package.

These objects are accomplished, in one aspect of the invention, by the provision of a method of making a pre-molded IC chip package which includes the step of pre-forming the terminal ends of a segment of lead-ins before the segment is affixed to the package. This procedure obviates the afore-mentioned disadvantages and provides a solid, economical package.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
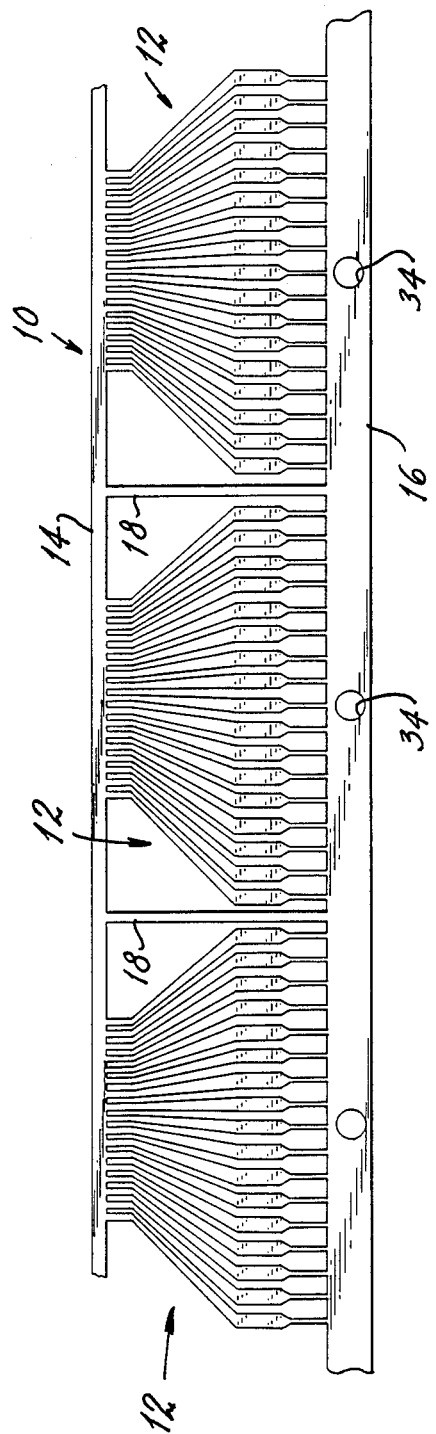
FIG. 1 is a plan view of a partial strip of lead-frame segments.
Figure 2:
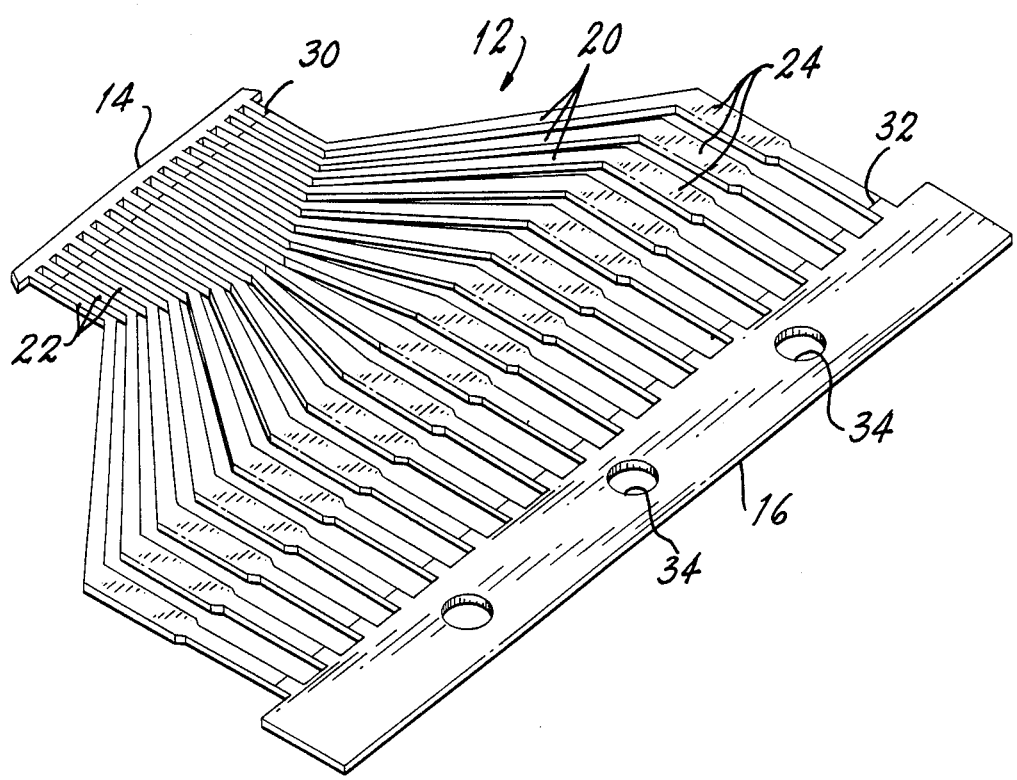
FIG. 2 is a perspective view of a single lead-frame segment.

Referring now to the drawings with greater particularity, there is shown in FIG. 1 a part of a long, longitudinal metal strip 10 containing a plurality of substantially identical lead-frame segments 12. An enlarged, perspective representation of a segment 12 is shown in FIG. 2. In one example, segments 12 were stamped from 0.010" copper alloy and were maintained in strip form by means of a first rail 14 and a second rail 16. Support bars 18 between segments can be provided if necessary.

In the illustrated embodiment each segment 12 comprises seventeen lead-ins 20. The inner ends 22 of lead-ins 20, which will eventually be electrically connected to an IC chip, are 0.009" wide and spaced 0.009" apart. The widest part 24 of lead-ins 20 are inward from the outer ends 26 thereof and are 0.028" wide and spaced 0.022" apart. There are score lines 30 and 32 on the lead-ins 20, about 0.005" from the rails 14 and 16. These rails will subsequently be removed. Apertures 34 are provided in second rail 16 for precise indexing.

Figure 3:
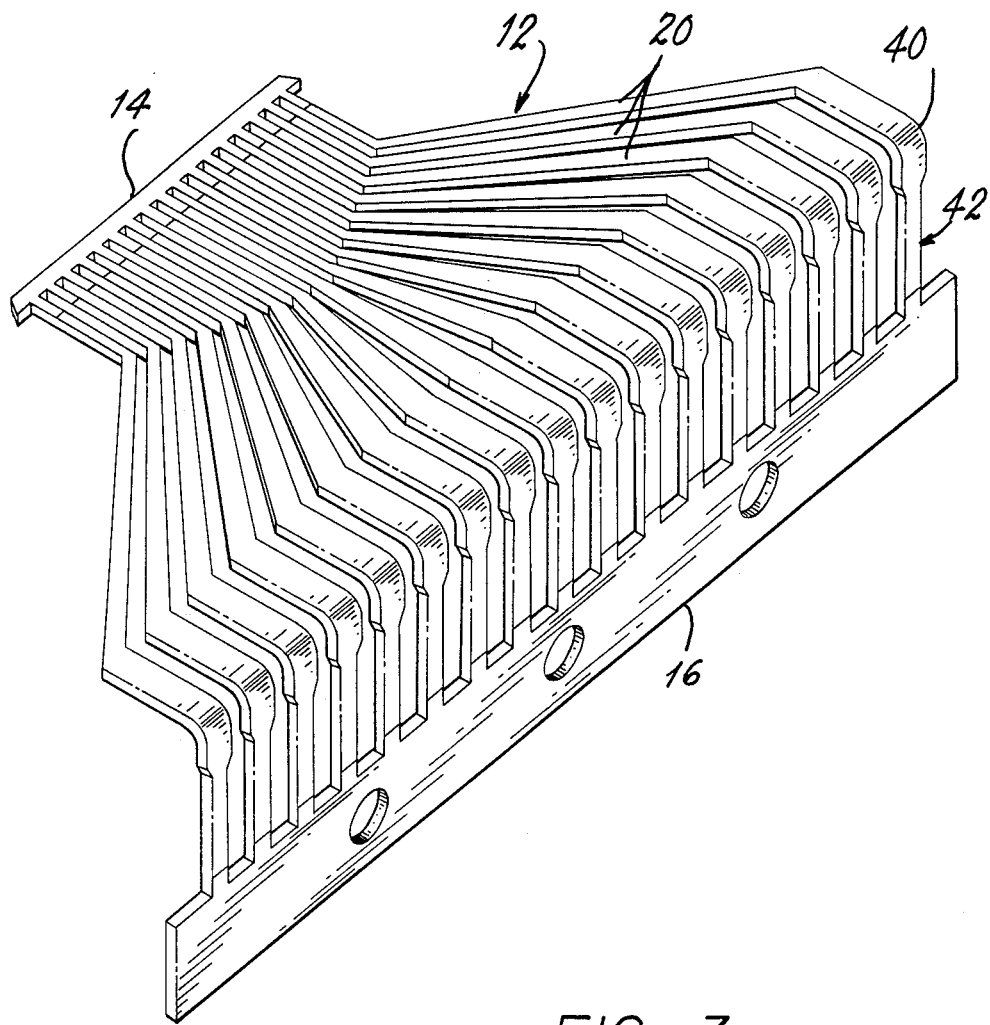
FIG. 3 is a view similar to FIG. 2 after a forming operation.

To pre-form the lead-ins 20 (in one embodiment) a segment 12, including its rails, is separated from strip 10. A first right angled bend 40 (see FIG. 3) is formed in the lead-ins 20, adjacent the second rail 16, and provides a normal portion 42; i.e., a section of the lead-ins 20 that now extends 90° the plane of the segment.

Figure 4:
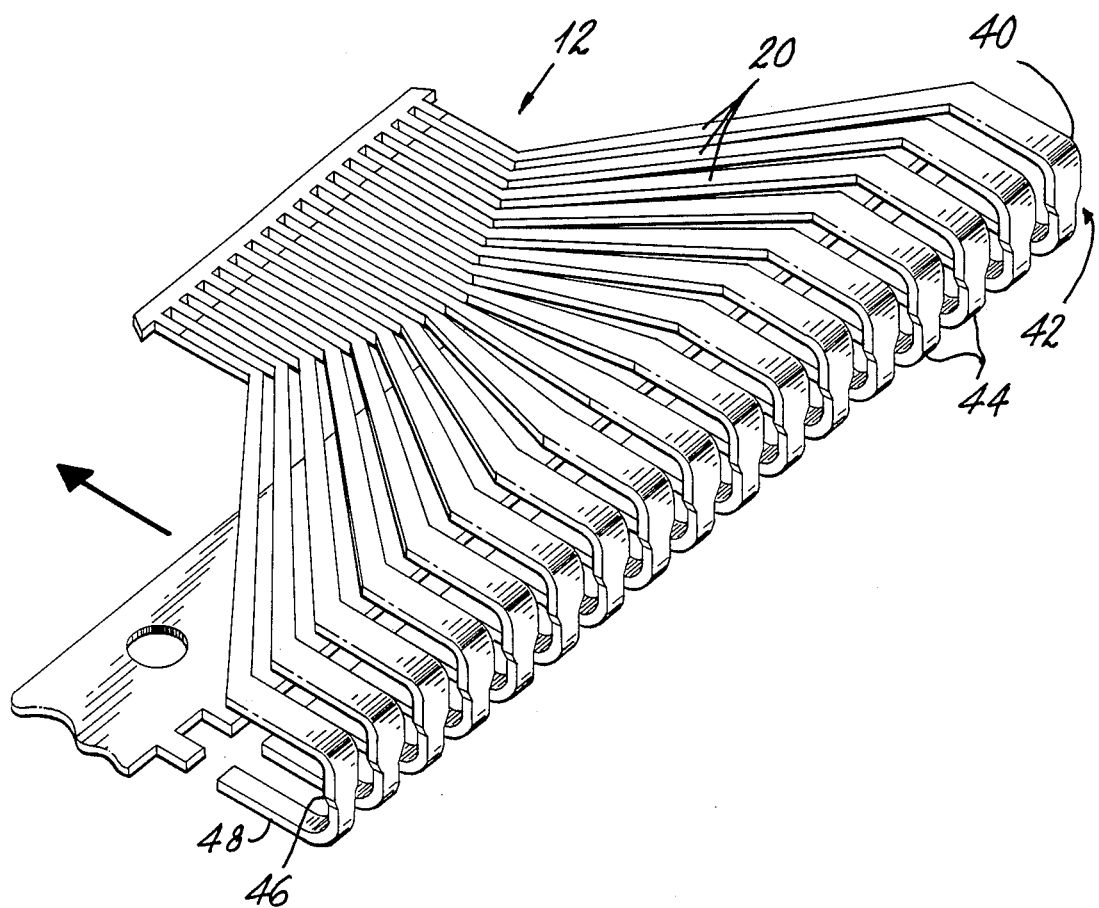
FIG. 4 is a view similar to FIG. 3 after additional forming.

A second right angled bend 44 (see FIG. 4) is formed in normal portion 42 to form a bight 46 and a parallel portion 48.

Figure 5:
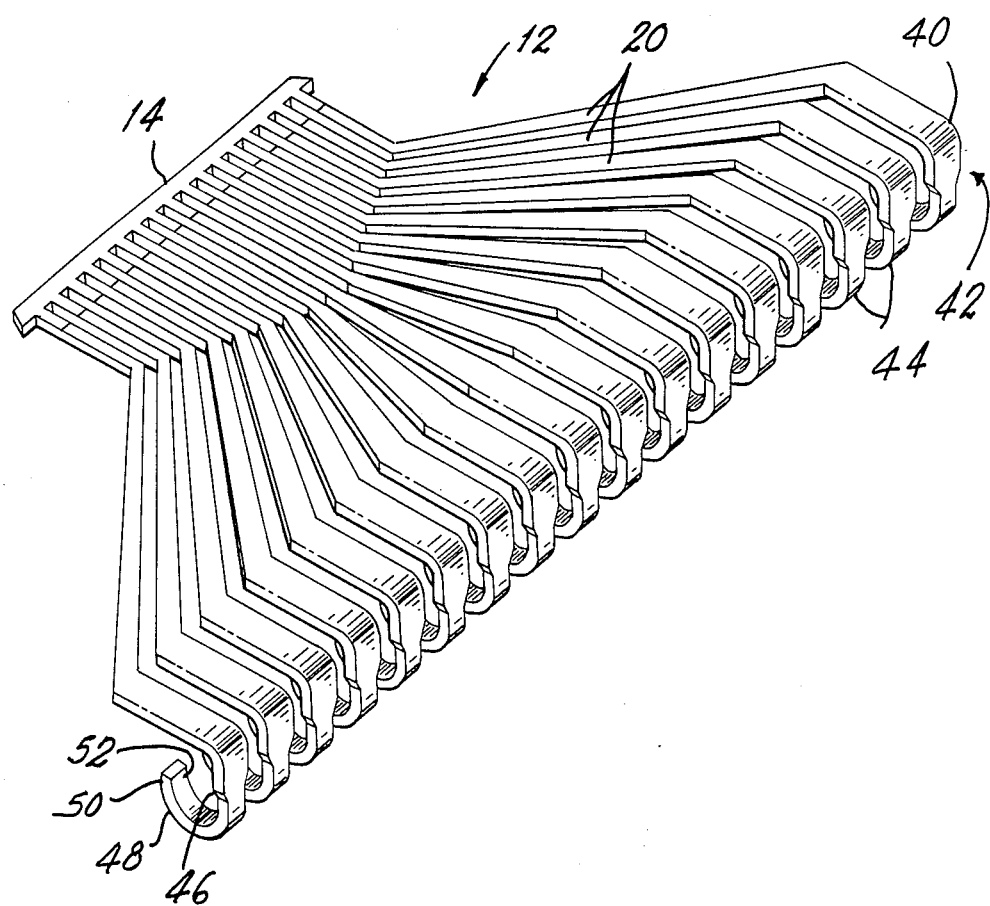
FIG. 5 is a view similar to FIG. 4 after another operation.

Second rail 16 is then removed and the terminal ends 50 (see FIG. 5), of lead-ins 20 are formed to provide a re-entrant portion 52. This configuration is conventionally known as a "J" lead.

Figure 6:
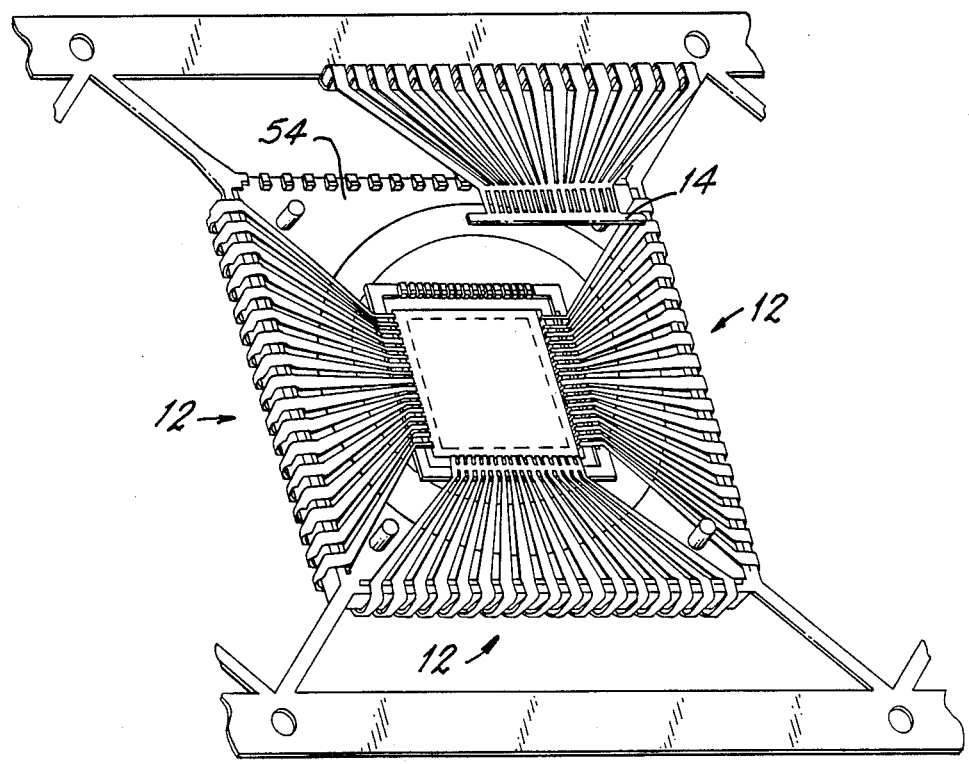
FIG. 6 is a perspective view of a support with three lead-frame segments attached an the fourth ready for attachment.

Upon completion of the formation of the lead-ins 20, the segment 12 is affixed to a substrate 54, as is shown in FIG. 6, and the first rail 14 is removed, thus completing a pre-formed IC package base which is ready to receive an IC chip.

In an alternate and more continuous process, the lead-ins 20 can be formed while the segments 12 are attached to strip 10. In the latter case, only a section of second rail 16, between segments, is removed, to allow the forming operation.

Accordingly, there is provided a process for making IC packages which includes pre-forming the lead-ins thereof, whereby stress and breakage in the substrate mounting the lead-ins is reduced.

While there have been shown and described what are at present considered to be the preferred embodiments of the invention, it will be apparent to those skilled in the art that various changes and modifications can be made herein without departing from the scope of the invention as defined by the appended claims.

We claim:

1. The method of making pre-formed lead-ins for an IC package comprising, in sequence, the steps of:

(a) preparing a longitudinal strip containing a plurality of substantially identical lead frame segments, each lead frame segment having a multiplicity of lead-ins connected to opposing, first and second continuous rails, said lead-ins having spaces therebetween with the spaces being wider adjacent said second rail than adjacent said first rail;

(b) removing from between segments a section of said second rail;

(c) forming a first right angled bend in said lead-ins of said lead-frame segment, adjacent said second rail to provide a normal portion of said lead-ins;

(d) forming a second right angled bend in said normal portion of said lead-ins of said lead-frame segment to form a bight and a parallel portion of said lead-ins;

(e) removing said second rail; and (f) forming a re-entrant portion in said parallel portion of said leads of said lead-frame segment to substantially complete said pre-formed lead-ins;

(g) separating said lead-frame segment from said strip;

(h) affixing said lead-frame segment to a lead frame support; and (i) removing said first rail.

* * * * *